(12) United States Patent
Wang et al.

(10) Patent No.: US 7,187,255 B2
(45) Date of Patent: Mar. 6, 2007

(54) ARRANGEMENT OF LATTICE FILTER

(75) Inventors: Kun Wang, Sunnyvale, CA (US); Michael Louis Frank, Los Gatos, CA (US); Richard Ruby, Menlo Park, CA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 99 days.

(21) Appl. No.: 10/974,078

(22) Filed: Oct. 26, 2004

(65) Prior Publication Data

US 2006/0087386 A1    Apr. 27, 2006

(51) Int. Cl.
*H03H 9/54* (2006.01)

(52) U.S. Cl. .................. 333/189; 333/190; 333/192

(58) Field of Classification Search .................. 333/190
See application file for complete search history.

(56) References Cited

U.S. PATENT DOCUMENTS

| | | | | |
|---|---|---|---|---|
| 5,692,279 | A * | 12/1997 | Mang et al. ............... | 29/25.35 |
| 6,215,375 | B1 * | 4/2001 | Larson et al. ............... | 333/187 |
| 6,278,342 | B1 | 8/2001 | Ella ........................... | 333/189 |
| 6,670,866 | B2 | 12/2003 | Ella et al. ................... | 333/133 |
| 6,992,420 | B2 * | 1/2006 | Jang et al. .................. | 310/324 |
| 2003/0112768 | A1 * | 6/2003 | Frank ......................... | 370/281 |
| 2005/0068125 | A1 * | 3/2005 | Unterberger et al. ....... | 333/190 |
| 2005/0212619 | A1 * | 9/2005 | Aigner et al. ............... | 333/189 |

FOREIGN PATENT DOCUMENTS

| WO | WO 03/056699 | * | 7/2003 |
|---|---|---|---|
| WO | WO 03/098802 | * | 11/2003 |
| WO | WO 2004/019491 | * | 3/2004 |

* cited by examiner

*Primary Examiner*—Barbara Summons

(57) ABSTRACT

A filter and method of manufacturing a filter having a lattice arrangement that efficiently utilizes substrate space. An embodiment of the invention is directed to a filter having a plurality of resonators disposed on a substrate, each resonator comprising a first electrode and a second electrode disposed vertically adjacent such that an acoustic cavity of a piezoelectric material is formed between each first electrode and each second electrode of each resonator, the first and second electrodes of each resonator electrically isolated from each other via the piezoelectric material. In this manner, the filter is realized without having to use any vias. Additionally, the resonators may be of a shape that allows each to be disposed close together such that some sides of each of the resonators are parallel to each other. Thus, substrate space can be preserved even further.

2 Claims, 5 Drawing Sheets

ARRANGEMENT OF LATTICE FILTER

BACKGROUND OF THE INVENTION

Mobile telecommunications devices continue to be manufactured in smaller and smaller packages. As a result, the electronic components within mobile telecommunication devices must also continue to be manufactured in smaller and smaller packages. A typical mobile telecommunication device uses a receiver and a transmitter to receive and transmit communication signals with other telecommunications devices. In receiving communication signals, a typical telecommunications device uses one or more filters to isolate the communication signal desired as there may be additional signals resident within a larger signal, e.g., a carrier signal, or a noise signal. As such, many different types of filters have been developed for the purpose of isolating particular portions of communication signals received by a receiver.

One type of filter often used in conjunction with well-known receiver architectures is a lattice filter. FIG. 1A is a schematic diagram of a conventional single-stage lattice filter 100 attached to a conventional balun 105 The lattice filter 100 is shown attached to the balun 105 because filters utilizing resonators typically have a balanced input and a balanced output. At the same time, typically these filters are connected to a conventional antenna which is an unbalanced, i.e., a single transmission path. but it is difficult to implement such a configuration with resonators. Therefore, the lattice filter 100 uses the balun 105 which is a signal line transformer for converting an unbalanced signal to a balanced signal. The balun 105 includes an unbalanced side 106 connected directly to the unbalanced input 101 and a balanced side connected to the balanced input 107 of the filter 100.

The lattice filter 100 includes a balanced input 107 and a balanced output 102. The filter 100 also includes four resonators 110a–d connected between the balanced input 108 and the balanced output 102 in the schematic arrangement shown in FIG. 1A.

The resonators 110a–d may be bulk acoustic-wave (BAW) devices that are, in general, comprised of a piezoelectric layer disposed between two electronically conductive layers that serve as electrodes. As such, when a radio frequency (RF) signal is applied across a resonator, a mechanical wave is generated in the piezoelectric layer. A fundamental resonance occurs when the wavelength of the mechanical wave is about twice the thickness of the piezoelectric layer. Although the resonant frequency of a BAW device also depends on other factors, the thickness of the piezoelectric layer is the predominant factor in determining the resonant frequency. As the thickness of the piezoelectric layer is reduced, the resonance frequency is increased. BAW devices have traditionally been fabricated on sheets of quartz crystals. In general, it is difficult to achieve a device of high resonance frequency using this fabrication method. When fabricating BAW devices by depositing thin-film layers on passive substrate materials, one can extend the resonance frequency to the 0.5–10 GHz range. These types of BAW devices are commonly referred to as thin-film bulk acoustic resonators or FBARs. FBAR resonators and the nature of their manufacturing are well known in the industry and are not discussed further herein.

Thus, when disposed on the substrate, each resonator 110a–d includes a top electrode 111a–d and a bottom electrode 112a–d that remain electrically isolated from one another by the piezoelectric material. By coupling the resonators in the schematic manner shown in FIG. 1A, an RF signal received at the unbalanced input (which is typically connected to a radio antenna (not shown)) can be filtered by adjusting the resonance frequencies and relative sizes of the resonators 110a and 110c in relation to those of resonators 110b and 110d. The physical wave characteristics and electronic aspects of lattice filters are also well-known in the industry and are not discussed further herein.

The balanced input 107 of the filter 100 comprises a first input terminal 108a and a second input terminal 108b. The first input terminal 108a is connected to the top electrodes 111a and 111b of the resonators 110a and 110b. Likewise, the second input terminal 108b is connected to the top electrodes 111c and 111d of the resonators 110c and 110d. In a similar manner, the balanced output 102 includes a first output terminal 103a and a second output terminal 103b. The first output terminal 103a is connected to the bottom electrodes 112a and 112d of the resonators 110a and 110d. Likewise, the second output terminal 103b is connected to the bottom electrodes 112b and 112c of the resonators 110b and 110c.

In this arrangement, a crossover 120 is necessary because of the cross-connected nature of the lattice arrangement. This is most typically accomplished by providing vias through the substrate in order to utilize both the top and bottom sides of the substrate to provide a signal path at the crossover 120. This is illustrated more clearly in the physical topology of the lattice filter 100 in FIG. 1B.

FIG. 1B is a top view a portion of the lattice filter 100 of FIG. 1A showing the physical topology of the crossover 120 between the resonators 110a–d. In general, the shaded areas of FIG. 1B represent the bottom electrodes of the illustrated resonators and the non-shaded areas represent the top electrodes of the illustrated resonators. As can be seen, the balanced input 108 includes the first input terminal 108a and the second input terminal 108b which are connected to the top side electrodes, i.e., the first input terminal 108a is connected to top electrodes 111a and 111b of the resonators 110a and 110b and the second input terminal 108b is connected to top electrodes 111c and 111d of the resonators 110c and 100d. Likewise, the balanced output 102 also includes the first output terminal 103a and the second output terminal 103b which are connected to the bottom electrodes, i.e., the first output terminal 103a is connected to the bottom electrodes 112a and 112d of the resonators 11a and 110d and the second output terminal 103b is connected to the bottom electrodes 112b and 112c of the resonators 110b and 110c.

The crossover 120 is realized by connecting the bottom electrodes of the diagonal resonators together, i.e., the bottom electrode 112b of resonator 110b to the bottom electrode 112c of resonator 10c and the bottom electrode 112d of resonator 110d to the bottom electrode 112a of resonator 110a. However, because the signal path must cross due to the arrangement of the resonators 110a–d, one of the two afore-mentioned connections must "crossover" the other. This is accomplished by etching the piezoelectric layer (not shown in detail) with vias that allow an electrical connection through the piezoelectric material. In particular, two vias 121a and 121d (not shown in detail) are disposed at two points which are near each respective bottom electrode 112a and 112d of the connecting resonators 110a and 110d. Using the vias 121a and 121d, a crossbar connector 122 disposed on the top side of the piezoelectric layer provides a connection between the vias 121a and 121d, i.e., an electrical connection between the bottom electrodes 112a and 112d. As such, electrical signals are able to travel from the bottom electrode 112a of the resonator 110a, to the first via 121a, through the via 121a to the crossbar connector 122 to the second via 121d, through the second via 121d to the bottom electrode 112d of the resonator 110d without ever interfering with the signal path between the bottom electrodes 112b and 112c of the resonators 110b and 110c which remains disposed entirely on the bottom side of the piezoelectric layer.

There are several drawbacks to this crossover arrangement of resonators 110a–d in a lattice filter 100. First, vias 121a and 121d require a specific amount of space to realize in the piezoelectric layer. As such, space is wasted between each resonator 110a–d because enough space must be left between each of the resonators 110a–d in order to achieve the crossover 120 using vias 121a and 121d. Since electronic components in mobile telecommunications devices are becoming increasingly smaller, the space between resonators 110a–d in lattice filters could be utilized in a more efficient manner.

Second, as signal path traces become smaller, electrical losses to signals propagating through the connection lines increase. Thus, if the signal path traces at the crossover 120 were to be designed smaller, the electrical losses to signals increase. Thus, wider signal path traces will prevent higher electrical losses, but at the expense of space being increased between the resonators 110a–d. Thus, the signal path traces can only become smaller to a point in which the electrical losses to the RF signal render the RF signal unrecognizable.

Third, even if space is not a limiting factor such that the signal path traces in the crossover 120 may be as wide as necessary so as to minimize electrical losses, the crossover point still creates a large "dead" resonator between the top and bottom side signal path traces. This dead resonator generates an appreciable acoustical loss in the RF signal. If the dead resonator becomes large enough, i.e., the signal path traces at the crossover point are large enough, the acoustical losses in the RF signal again will degrade the filter performance.

Thus, in a lattice filter arrangement utilizing a crossover connection, a constant tradeoff is negotiated in designing a filter that balances the acoustical losses to the RF signal if designed to be larger and the electrical losses to the RF signal if the designed to be smaller. The crossover poses a problem of not allowing the filter to be disposed in as little space as possible because there must remain a finite amount of space between resonators in order to dispose the vias between the resonators so as to couple the resonators in the correct filter schematic arrangement.

SUMMARY OF THE INVENTION

An embodiment of the invention is directed to a filter having a plurality of resonators disposed on a substrate, each resonator comprising a first electrode and a second electrode disposed vertically adjacent such that an acoustic cavity of a piezoelectric material is formed between each first electrode and each second electrode of each resonator, the first and second electrodes of each resonator electrically isolated from each other via the piezoelectric material. Further, each of the resonators are disposed such that a balanced input having a first input terminal that is connected to the first electrode of a first resonator and a second input terminal that is connected to the first electrode of a second resonator provides a filter input. Likewise, a balanced output having a first output terminal that is connected the second electrode of the first resonator and a second output terminal that is connected to the second electrode of a third resonator provides a filter output.

In this manner, the filter is realized without having to use any vias in order to propagate input and output signals in the appropriate manner. Further, substrate space can be saved because the vias do not need to be realized between resonators. Additionally, the resonators may be of a shape that allows each to be disposed close together such that some sides of each of the resonators are parallel to each other. Thus, substrate space can be preserved even further.

In another embodiment, the filter includes a second stage connected to the first stage. The resonators of the second stage are arranged in a similar manner such that no vias are required and substrate space is preserved.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION

The following discussion is presented to enable a person skilled in the art to make and use the invention. The general principles described herein may be applied to embodiments and applications other than those detailed above without departing from the spirit and scope of the present invention. The present invention is not intended to be limited to the embodiments shown, but is to be accorded the widest scope consistent with the principles and features disclosed or suggested herein.

Figure 1A:
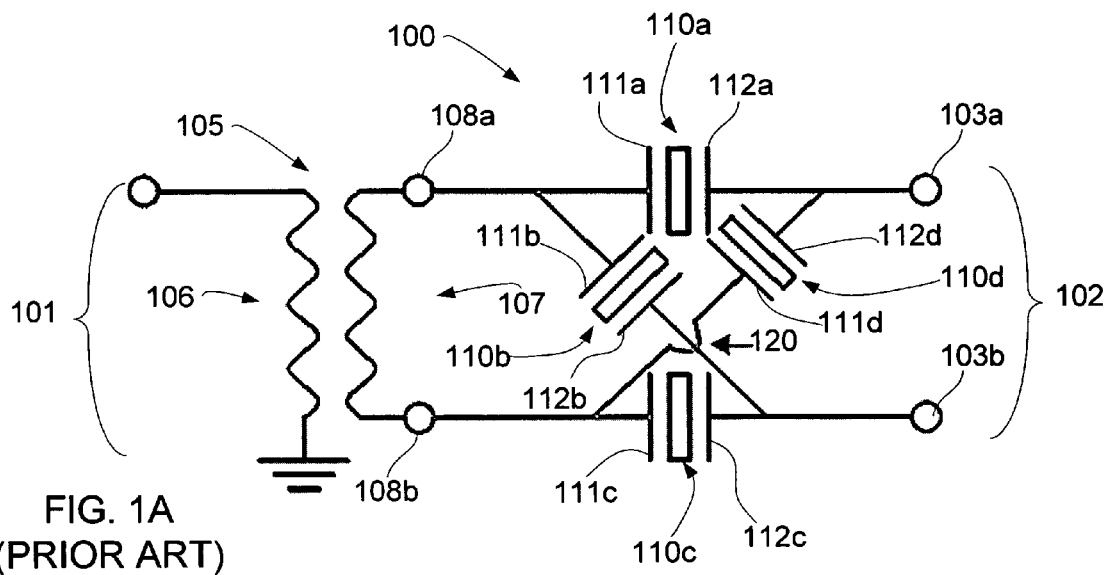
FIG. 1A is a schematic diagram of a conventional single-stage lattice filter.
Figure 1B:
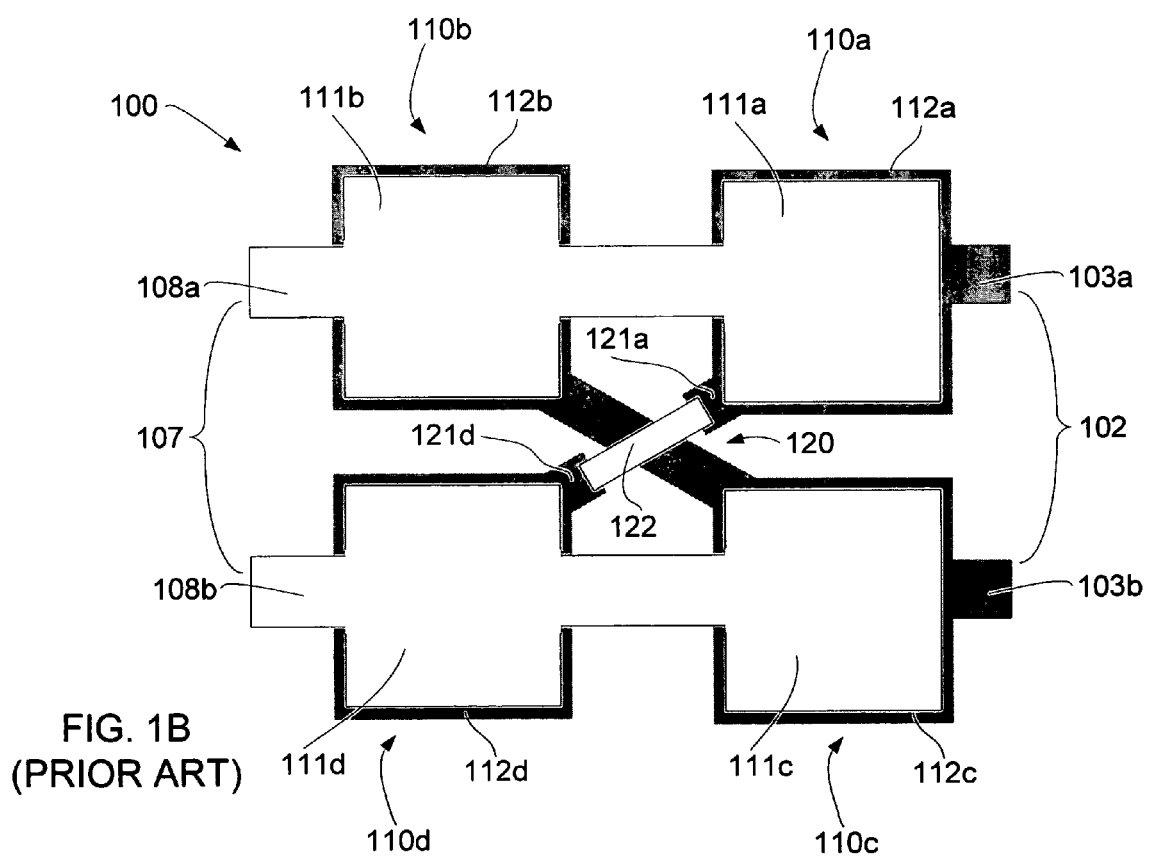
FIG. 1B is a top view a portion of the conventional lattice filter of FIG. 1A showing the physical topology of a filter that includes a crossover between resonators.
Figure 2:
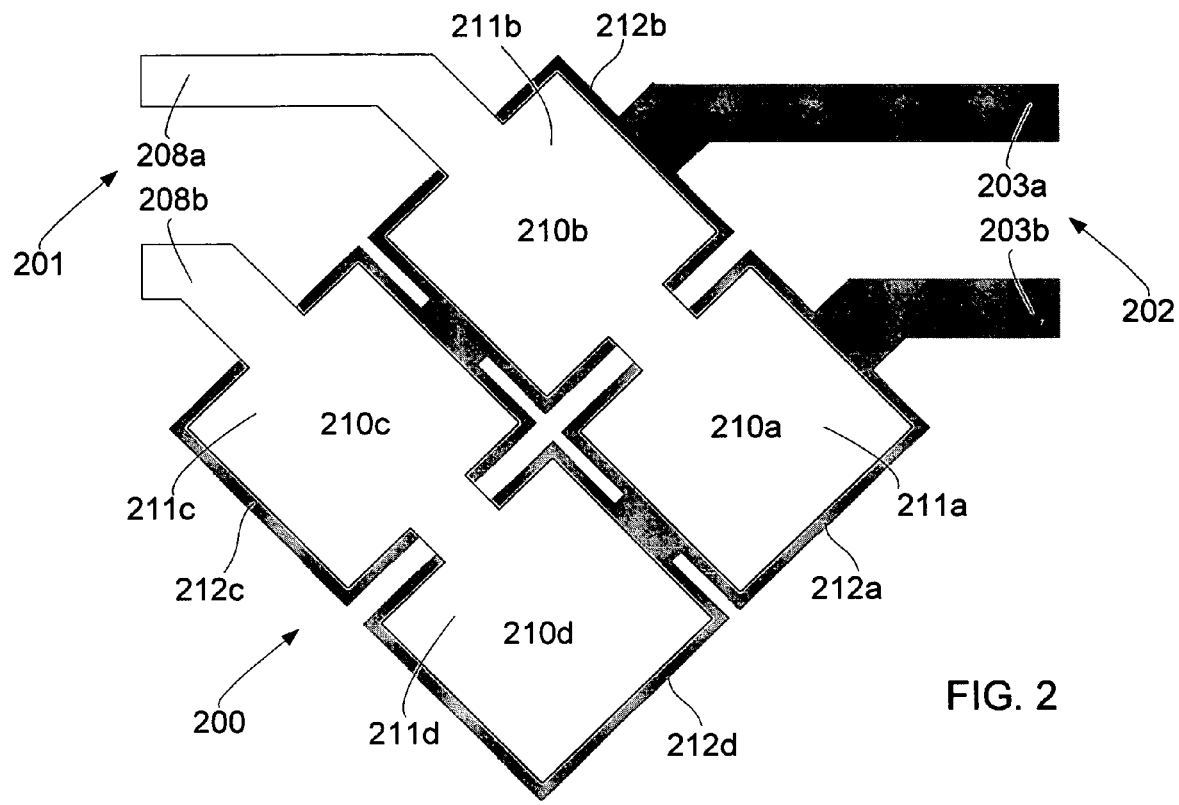
FIGS. 2 and 2A are top views of a portion of a filter showing the physical topology of the layout of a plurality of resonators according to various embodiments of the invention.

FIG. 2 is a top view a portion of a filter 200 showing the physical topology of the layout of a plurality of resonators 210a–d according to an embodiment of the invention. The filter 200 includes four resonators 210a–d arranged in a rectangular pattern and without a crossover as was the case with lattice filters in the prior art, such as the filter 100 of FIG. 1B. The filter 200 further includes a balanced input 201 across input terminals 208a and 208b and a balanced output 202 across output terminals 203a and 203b.

As was the discussed above, shaded areas of FIG. 2 represent components disposed on the bottom side of the piezoelectric layer (piezoelectric layer not shown in detail) while non-shaded areas represent components disposed on the top side of the piezoelectric layer. As can be seen, the first input terminal 208a and the second input terminal 208b of the balanced input 201 are connected to the top electrodes of the filter 200, i.e., the first input terminal 208a is electrically connected to the top electrodes of the resonators 210a and 210b and the second input terminal 208b is electrically connected to the top electrodes of the resonators 210c and 210d. Likewise, the first output terminal 203a and the second output terminal 203b of the balanced output 202 are connected to the bottom electrodes, i.e., the first output terminal 203a is electrically connected to the bottom electrodes of the resonators 210b and 210c and the second output terminal 203b is electrically connected to the bottom electrodes of the resonators 210a and 210d.

Thus, an RF signal passed to the balanced input 201 (input terminals 208a and 208b) will propagate through the resonators 210a–d to the balanced output (output terminals 203a and 203b) and will be filtered accordingly depending on the relative size and frequency of each of the resonators 210a–d. Again, the electronic characteristics of the lattice filters are well known in the art and are not discussed herein.

By eliminating the need for a crossover connection, as was discussed about with respect to FIG. 1B, each of the resonators 210a–d may be realized closer together, thus preserving space on the substrate. A smaller area required for filters on the substrate allows for smaller telecommunications devices. Furthermore, the "dead" resonator described above with respect to FIG. 1B is eliminated, thus quelling any acoustic loss due to resonation at any crossover point.

Figure 2A:
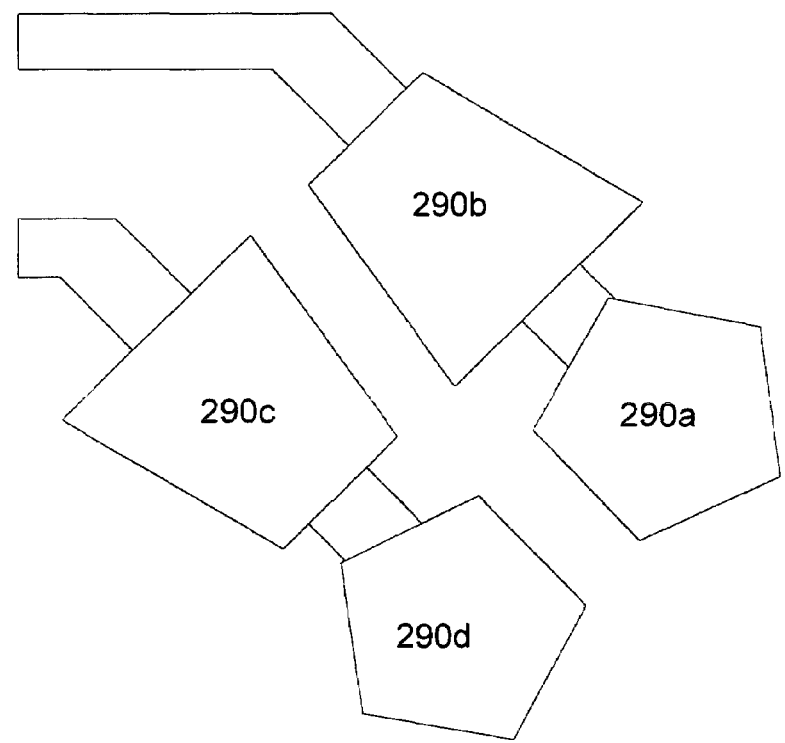

Each resonator 210a–d is substantially rectangular in the plane of the substrate and is typically disposed on the substrate adjacent to at least two other resonators such that at least two sides of every resonator are parallel with at least one side of an adjacent resonator. For example, resonator 210a includes one side that is parallel with one side of resonator 210b as well as another side that is parallel with resonator 210d. Note that although shown as substantially square and all of relatively similar size in FIG. 2, each resonator 210a–d may be other shapes such as rectangular, trapezoidal, or pentagonal in shape and of virtually any size depending the filter characteristics required. FIG. 2A shows resonators 290a–d having differing shapes according to other embodiments of the invention. Resonators 290b and 290c are shown as trapezoidal while resonators 290a and 290d are shown as pentagonal. Irregular shapes of resonators help to eliminate unwanted resonance modes. Further, each of the resonators 290a–d need not be the same shape as each other. For example, two resonators 290a and 290d may be pentagonal, while the other two resonators 290c and 290d may be a trapezoidal shape.

In addition to a number of different shapes, each resonator 210a–d may be an FBar resonator, a BAW resonator, or any other suitable resonator. Because the vias no longer need to be realized between resonators 210a–d, the resonators 210a–d, may be disposed much closer together. As a result, the input terminals 208a and 208b and the output terminals 203a and 203b may also be disposed much closer together. Thus, substrate space is preserved even further.

One of the only limiting factors on the size of the overall filter is the requirement of the size of the wiring traces to the balanced input 201 and the balanced output 202 and the size of the resonators 210a–d. Larger resonators 210a–d and wiring traces will result is a smaller electrical loss, however, the trade-off of increasing acoustic loss because of a large crossover resonator (dead resonator) is no longer a limiting factor because the crossover is eliminated in the filter 200 of FIG. 2.

An additional benefit of realizing a filter 200 according to the embodiment shown in FIG. 2 is simplified manufacturing as compared to filters in the prior art. Because the crossover has been eliminated, there is no need to provide vias through the piezoelectric material. As was discussed above, vias require a finite amount of space for implementation and encompass a measurable complexity during the manufacturing process. The elimination of the crossover alleviates the need for vias, thereby, simplifying the manufacturing process and allowing the resonators 210a–d to be realized closer together, which, in turn saves space and allows the overall filter to be realized in a much smaller area.

The filter 200 shown in FIG. 2 is an embodiment of a single-stage filter or, alternatively, may be the first stage of a multiple stage filter. That is, an RF signal only passes though a single filtering stage in the filter 200 of FIG. 2. Additional filtering stages or filters comprising two stages may also be realized according to some embodiments of the invention.

Figure 3:
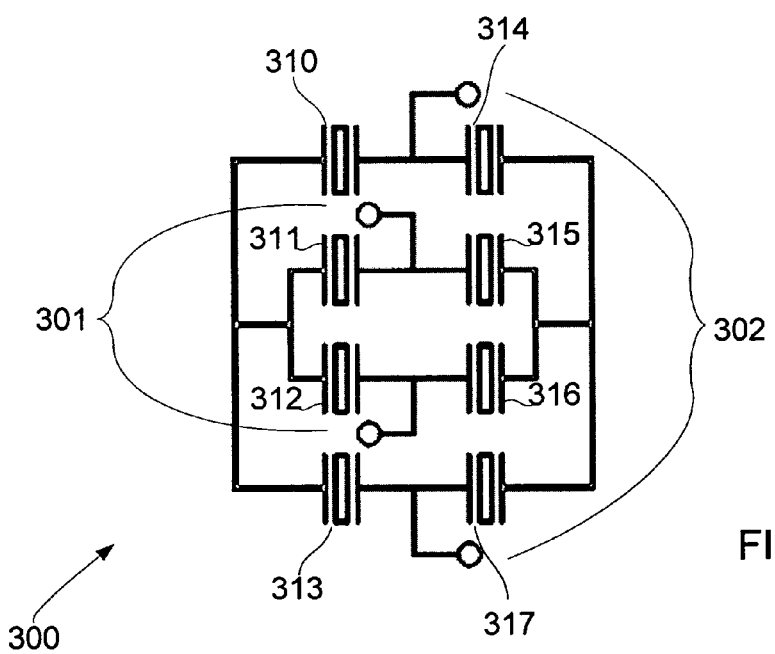
FIG. 3 is a schematic diagram of a two-stage filter according to an embodiment of the invention.

FIG. 3 is a schematic diagram of a two-stage filter 300 according to an embodiment of the invention. The filter 300 includes a plurality of resonators 310–317 arranged schematically in a first filter stage and a second filter stage. Although the first stage and the second stage are abstracted by the schematic diagram of FIG. 3, conceptually, the first stage comprises resonators 311, 312, 315, and 316 while the second stage comprises resonators 310, 313, 314, and 317. The first stage is electrically connected to a balanced input 301 such that one input terminal is connected to the bottom electrodes of resonators 311 and 315 and the other input terminal is electrically connected to the bottom electrodes of resonators 312 and 316. In a similar manner, the second stage is electrically connected to a balanced output 302 such that one output terminal is connected to the bottom electrodes of resonators 310 and 314 and the other output terminal is electrically connected to the bottom electrodes of resonators 313 and 317.

A two-stage filter, such as filter 300, is advantageous over a single-stage filter in that better roll-off at the pass band edges is provided. That is, because the filter is essentially doubled up, the attenuation outside the pass band is twice the magnitude that it is with a single-stage filter. The resultant overall filtering effect is more efficient attenuation of frequencies outside the pass band. A slight drawback to having a two-stage filter, however, is the increased electrical losses because the RF signal must pass through additional circuitry.

Figure 4:
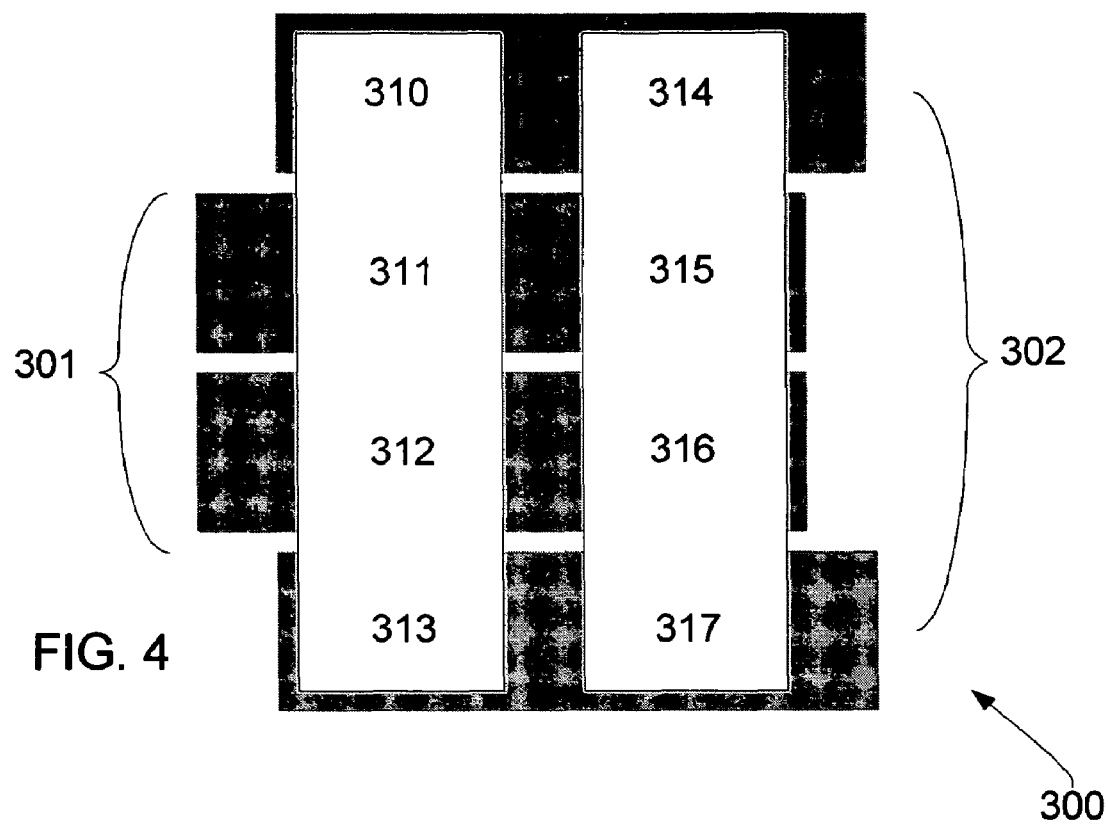
FIG. 4 is a top view of the filter of FIG. 3 showing the physical topology of the layout of the plurality of resonators according to an embodiment of the invention.

FIG. 4 is a top view of the filter 300 of FIG. 3 showing the physical topology of the layout of the plurality of resonators 310–317 according to an embodiment of the invention. The filter 300 includes eight resonators 310–317 arranged in a rectangular pattern and again without a crossover as was the case with lattice filters in the prior art, such as the filter 100 of FIG. 1B. The filter 300 further includes a balanced input 301 and a balanced output 302. The filter 300 is arranged as a two-stage filter; however, the demarcation of the two stages is abstracted due to the physical layout of the resonators 310–317. As was the case above with respect to FIG. 3, the first stage comprises resonators 311, 312, 315, and 316 while the second stage comprises resonators 310, 313, 314, and 317.

As was the discussed above, shaded areas of FIG. 4 represent bottom electrodes (piezoelectric layer not shown in detail) while non-shaded areas represent top electrodes. As can be seen, the balanced input 301 is connected to the bottom electrodes of resonators 311, 312, 315, and 316. Likewise, the balanced output 302 is also connected to the bottom electrodes of resonators 310, 313, 314, and 317.

Again, each of the resonators 310–317 is shown in FIG. 4 as substantially rectangular in the plane of the substrate and is typically disposed on the substrate adjacent to at least two other resonators such that at least two sides of every resonator are parallel with at least one side of an adjacent resonator. As a result, the filter 300 forms a rectangular area on the substrate and the balance input 301 and the balanced output 302 are able to be realized on opposite sides of the rectangular filter area. That is, the input wiring traces and the output wiring traces are able to flow from left to right without having to loop around the filter area to continue a wire trace to the next component. Again, because no vias need to be realized between resonators, the resonators 310–317 may be disposed much closer together. As a result, the balanced input 301 and the balanced output 302 may also be disposed much closer together. Thus, substrate space is preserved even further.

In an alternative embodiment not shown, each of the resonators 310–317 may be substantially trapezoidal or pentagonal in shape in the plane of the substrate and is typically disposed on the substrate adjacent to at least two other resonators such that at least two sides of every resonator are parallel with at least one side of an adjacent resonator. Again, the filter 300 forms a uniform area on the substrate and the balanced input 301 and the balanced output 302 are able to be realized on opposite sides of the uniform filter area.

Again, one of the only limiting factors on the size of the overall filter 300 is the requirement of the size of the wiring traces to the balanced input 301 and the balanced output 302 and the size of the resonators 310–317. Larger resonators 310–317 and wiring traces will result is a smaller electrical loss, however, the trade-off of increasing acoustic loss because of a large crossover resonator (dead resonator) is no longer a limiting factor because the crossover has been eliminated.

As was discussed above, an additional benefit of realizing a filter 300 according to the embodiment shown in FIG. 4 is simplified manufacturing as compared to filters in the prior art. Because the crossover has been eliminated, there is no need to provide vias through the piezoelectric material of the substrate. As was discussed above, vias require a finite amount of space for implementation and encompass a measurable complexity during the manufacturing process. The elimination of the crossover alleviates the need for vias, thereby, simplifying the manufacturing process and allowing the resonators 310–317 to be realized closer together, which, in turn saves space and allows the filter 300 to be realized in a smaller area.

Figure 5:
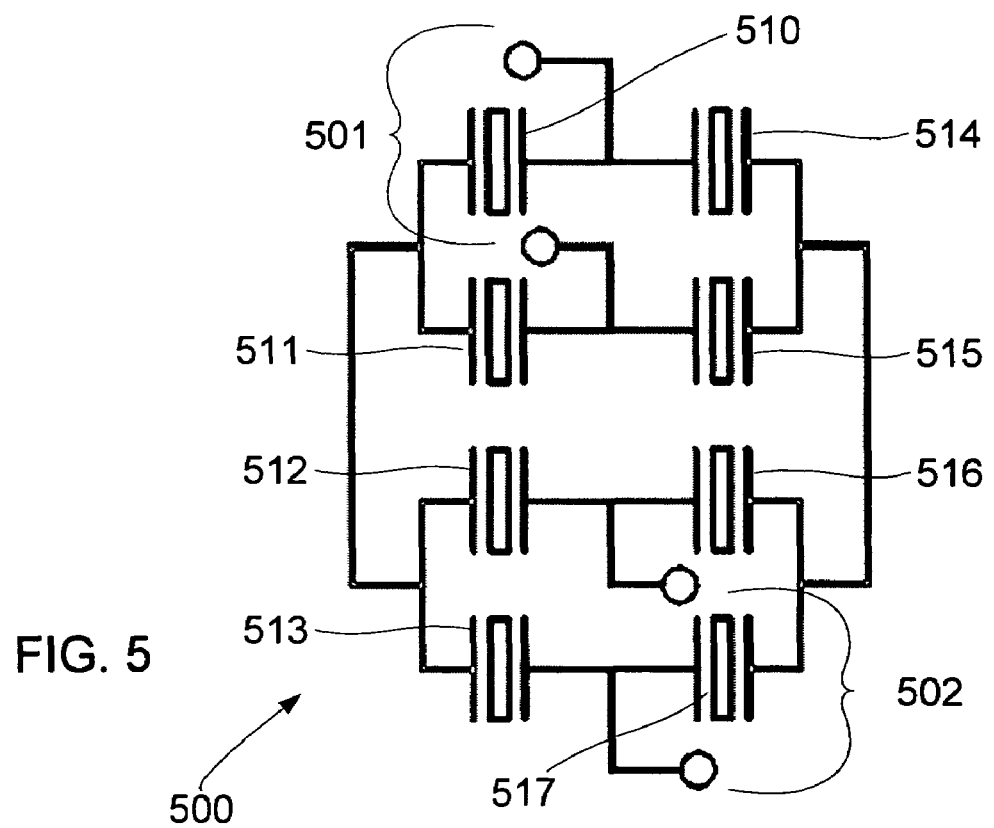
FIG. 5 is a schematic diagram of another two-stage filter according to an embodiment of the invention.

FIG. 5 is a schematic diagram of alternative arrangement of two-stage filter 500 according to an embodiment of the invention. The filter 500 again includes a plurality of resonators 510–517 arranged schematically in a first filter stage and a second filter stage. Similar to filter 300 of FIG. 3, the first stage and the second stage are abstracted, albeit a bit less, by the schematic diagram of FIG. 5. Conceptually, the first stage comprises resonators 510, 511, 514, and 515 while the second stage comprises resonators 512, 513, 516, and 517. The first stage is electrically connected to a balanced input 501 such that one input terminal is connected to the bottom electrodes of resonators 510 and 514 and the other input terminal is electrically connected to the bottom electrodes of resonators 511 and 515. In a similar manner, the second stage is electrically connected to a balanced output 502 such that one output terminal is connected to the bottom electrodes of resonators 512 and 516 and the other output terminal is electrically connected to the bottom electrodes of resonators 513 and 517.

Again the two-stage filter 500 is advantageous over a single-stage filter in that better roll-off at the pass band edges is provided. The resultant overall filtering effect is more efficient attenuation of frequencies outside the pass band. A slight drawback to having a two-stage filter, however, is the increased electrical losses because the RF signal must pass through additional circuitry.

Figure 6:
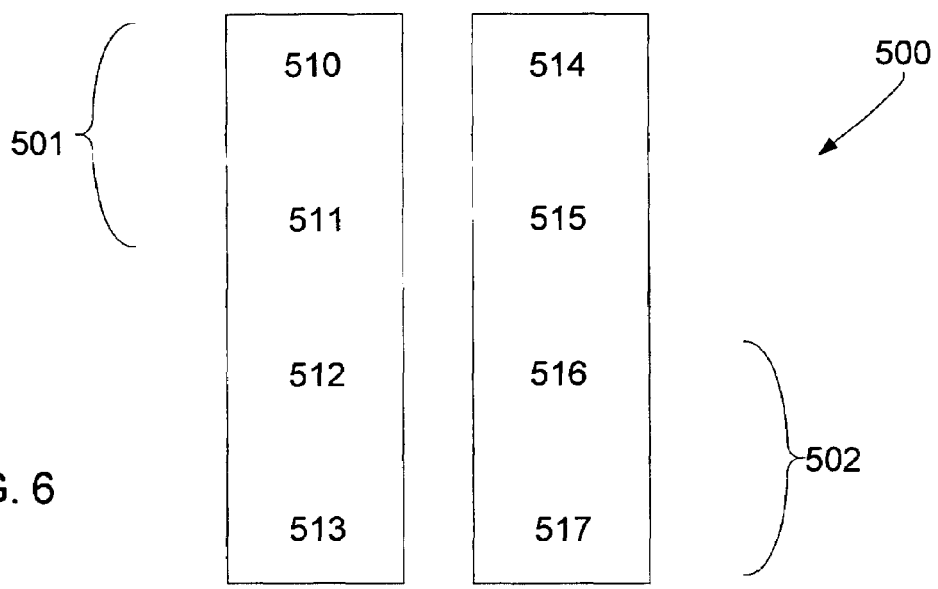
FIG. 6. is a top view of the filter of FIG. 5 showing the physical topology of the layout of the plurality of resonators according to an embodiment of the invention.

FIG. 6 is a top view of the filter 500 of FIG. 5 showing the physical topology of the layout of the plurality of resonators 510–517 according to an embodiment of the invention. The filter 500 includes eight resonators 510–517 arranged in a rectangular pattern and again without a crossover as was the case with lattice filters in the prior art, such as the filter 100 of FIG. 1B. The filter 500 further includes a balanced input 501 and a balanced output 502. The filter 500 is arranged as a two-stage filter, and, the demarcation of the two stages can be more readily seen as the top four resonators 510, 511, 514, and 515 form the first stage and the resonators 512, 513, 516, and 517 form the second stage.

As was the discussed above, shaded areas of FIG. 6 represent bottom electrodes (piezoelectric layer not shown in detail) while non-shaded areas represent top electrodes. As can be seen, the balanced input 501 is connected to the bottom electrodes of resonators 510, 511, 514, and 515. Likewise, the balanced output 502 is also connected to the bottom electrodes of resonators 512, 513, 516, and 517.

As was the case before, each of the resonators 510–517 as shown in FIG. 6 is substantially rectangular in the plane of the substrate and is typically disposed on the substrate adjacent to at least two other resonators such that at least two sides of every resonator are parallel with at least one side of an adjacent resonator. As a result, the filter 500 forms a rectangular area on the substrate and the balance input 501 and the balanced output 502 are able to be realized on opposite sides of the rectangular filter area. That is, the input wiring traces and the output wiring traces are able to flow from left to right without having to loop around the filter area to continue a wiring trace to the next component. Again, because no vias need to be realized between resonators, the resonators 510–517, may be disposed much closer together. As a result, the balanced input 501 and the balanced output 502 may also be disposed much closer together. Thus, substrate space is preserved even further.

In an alternative embodiment not shown, each of the resonators 510–517 may be substantially trapezoidal or pentagonal in shape in the plane of the substrate and is typically disposed on the substrate adjacent to at least two other resonators such that at least two sides of every resonator are parallel with at least one side of an adjacent resonator. Again, the filter 500 forms a uniform area on the substrate and the balanced input 501 and the balanced output 502 are able to be realized on opposite sides of the uniform filter area.

Figure 7:
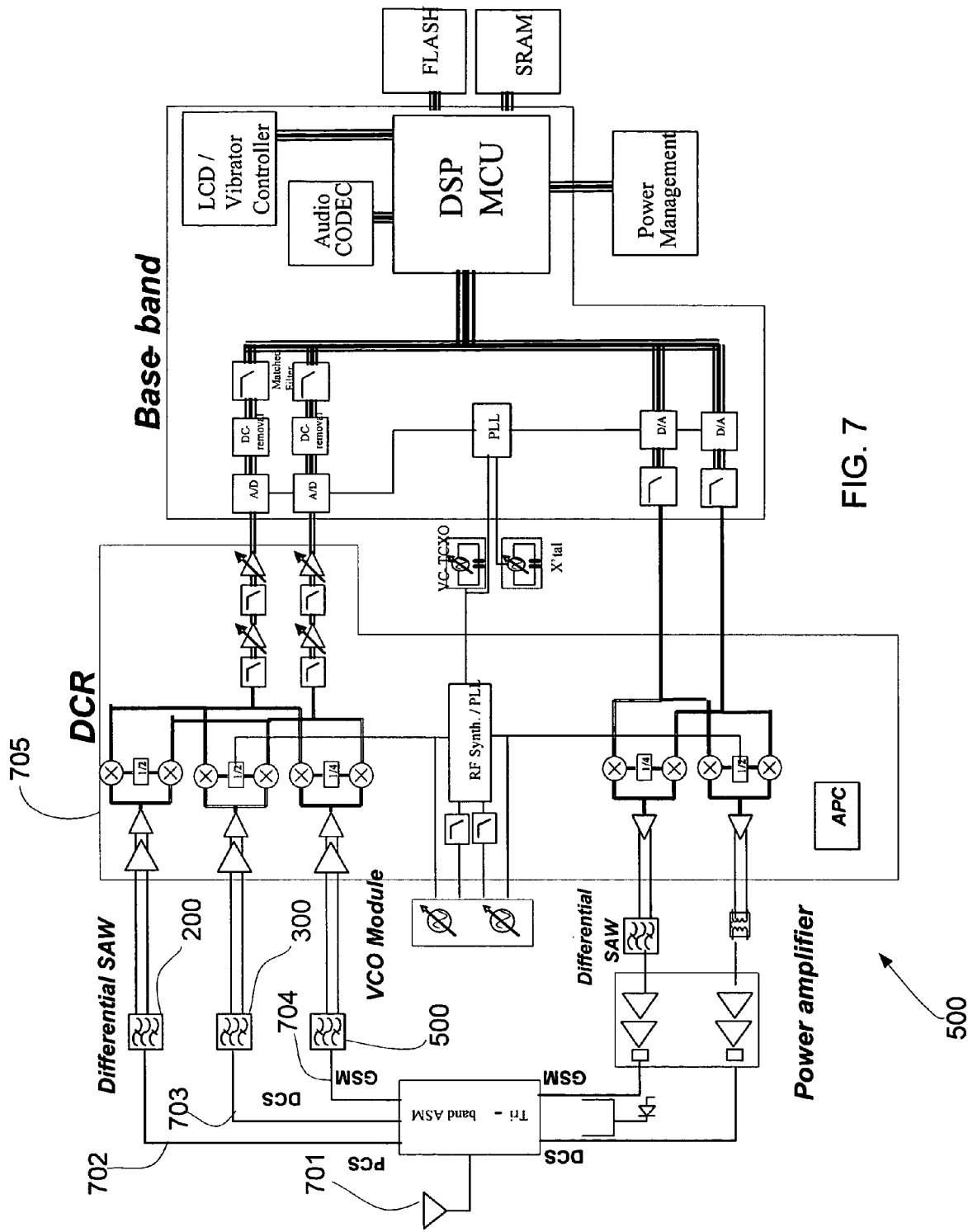
FIG. 7 is a block diagram of a communication system using one or more filters discussed above in FIGS. 2–6 according to an embodiment of the invention.

FIG. 7 is a block diagram of a communication system 700 using one or more filters discussed above in FIGS. 2–6 according to an embodiment of the invention. The communication system 700, which may be a typical transceiver for use in cellular phone technology, includes several stages for receiving and manipulating RF signals. Each of the stages for handling RF signals in a communications environment will not be discussed herein as this is well known in the art. The RF signals with respect to the filters of the present invention, however, are discussed below.

Typically, an RF signal will be received by an antenna 701 of the communication system. The RF signal is received as an unbalanced signal and may be transmitted to one or more of a plurality of paths. Examples of signal paths shown in FIG. 7 include a Personal Communication Service (PCS) path 702, a Digital Cellular System (DCS) path 703 and a Global System for Mobile Communication (GSM) path 704. The nature of the signal path is unimportant to the aspects of the present invention and the foregoing is merely provided as examples possible uses for the present invention.

Each path includes one or more filters of the present invention. For example, the PCS path 702 may include filter 200. Similarly, the DCS path 703 may include filter 300. Much the same, the GSM path 704 may include filter 500. The particular signal path or the particular filter are not exclusive as any signal path may utilize any embodiment of the present invention such that any RF signal propagating on any given path originates when received at the antenna, is transmitted to a filter where the unbalanced signal is converted to a balanced signal through a balun (not shown in detail) and then filtered by one or more filters according to various embodiments discussed above. After the RF signal is filtered, it may be transmitted to a direct conversion receiver 705 (DCR) for further signal manipulation.

As such a typical system designed according to an embodiment of the invention may include an antenna operable to receive radio frequency signals, at least one transceiver port connected to the antenna, the transceiver port including: (1) a balun having an unbalanced input and a balanced output, the unbalanced input connected to the antenna; and (2) a filter having a balanced input and a balanced output. The filter further includes a first filter stage having a plurality of resonators disposed on a substrate; each resonator comprising a first electrode and a second electrode disposed vertically adjacent such that an acoustic cavity is formed between each first electrode and each second electrode of each resonator, wherein each resonator is disposed on the substrate such that each first electrode is disposed on a first side of the substrate and each second electrode is disposed on a second, opposite side of the substrate, the first and second sides of the substrate electrically isolated from each other, a balanced input having a first input terminal and a second input terminal, the first input terminal connected to the first electrode of a first resonator and the second input terminal connected to the first electrode of a second resonator, and a balanced output having a first output terminal and a second output terminal, the first output terminal connected to the second electrode of a third resonator and the second output terminal connected to the second electrode of a first resonator. The communication finally also may include a direct conversion receiver connected to the balanced output of the first stage of the filter.

We claim:

1. A filter, comprising:
    a first stage having a plurality of resonators disposed on a substrate, each resonator comprising a first electrode and a second electrode disposed vertically adjacent such that an acoustic cavity of a piezoelectric material is formed between each first electrode and each second electrode of each resonator, the first and second electrodes of each resonator electrically isolated from each other via the piezoelectric material;
    a balanced first stage input having a first input terminal and a second input terminal, the first input terminal connected to the first electrode of a first resonator and the second input terminal connected to the first electrode of a second resonator;
    a balanced first stage output having a first output terminal and a second output terminal, the first output terminal connected to the second electrode of the first resonator and the second output terminal connected to the second electrode of a third resonator;
    a second stage connected to the first stage; the second stage having a balanced second stage input having a first input terminal and a second input terminal, the first input terminal connected to the first electrode of a fifth resonator and the first output terminal of the balanced output of the first stage and the second input terminal connected to the first electrode of a sixth resonator and the second output terminal of the balanced output of the first stage; and
    a balanced second stage output having a first output terminal and a second output terminal, the first output terminal connected to the second electrode of the fifth resonator and the second output terminal connected to the second electrode of a seventh resonator;
    wherein each resonator is disposed such that at least two resonators of the first stage are adjacent to at least two resonators of the second stage, each resonator is substantially trapezoidal in the plane of the substrate, and each resonator is disposed on the substrate adjacent to at least two other resonators such that at least two sides of every resonator are parallel with at least one side of an adjacent resonator.

2. A filter, comprising:
    a first stage having a plurality of resonators disposed on a substrate, each resonator comprising a first electrode and a second electrode disposed vertically adjacent such that an acoustic cavity of a piezoelectric material is formed between each first electrode and each second electrode of each resonator, the first and second electrodes of each resonator electrically isolated from each other via the piezoelectric material;
    a balanced first stage input having a first input terminal and a second input terminal, the first input terminal connected to the first electrode of a first resonator and the second input terminal connected to the first electrode of a second resonator;
    a balanced first stage output having a first output terminal and a second output terminal, the first output terminal connected to the second electrode of the first resonator and the second output terminal connected to the second electrode of a third resonator;
    a second stage connected to the first stage; the second stage having a balanced second stage input having a first input terminal and a second input terminal, the first input terminal connected to the first electrode of a fifth resonator and the first output terminal of the balanced output of the first stage and the second input terminal connected to the first electrode of a sixth resonator and the second output terminal of the balanced output of the first stage; and
    a balanced second stage output having a first output terminal and a second output terminal, the first output terminal connected to the second electrode of the fifth resonator and the second output terminal connected to the second electrode of a seventh resonator;

wherein each resonator is disposed such that at least two resonators of the first stage are adjacent to at least two resonators of the second stage, each resonator is substantially pentagonal in the plane of the substrate, and each resonator is disposed on the substrate adjacent to at least two other resonators such that at least two sides of every resonator are parallel with at least one side of an adjacent resonator.

* * * * *